United States Patent
Coskun et al.

(10) Patent No.: US 10,495,983 B2
(45) Date of Patent: *Dec. 3, 2019

(54) PIECEWISE ALIGNMENT MODELING METHOD

(71) Applicant: Applied Materials, Inc., Santa Clara, CA (US)

(72) Inventors: Tamer Coskun, San Jose, CA (US); Hwan J. Jeong, Los Altos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/146,951

(22) Filed: Sep. 28, 2018

(65) Prior Publication Data

US 2019/0033729 A1 Jan. 31, 2019

Related U.S. Application Data

(63) Continuation of application No. 15/644,284, filed on Jul. 7, 2017, now Pat. No. 10,133,193.

(60) Provisional application No. 62/364,230, filed on Jul. 19, 2016.

(51) Int. Cl.
*G03F 7/20* (2006.01)
(52) U.S. Cl.
CPC ................ *G03F 7/70633* (2013.01)
(58) Field of Classification Search
CPC .................................................. G03F 7/70633
See application file for complete search history.

(56) References Cited

U.S. PATENT DOCUMENTS

| 8,248,579 | B2 | 8/2012 | Mos et al. |
| 9,250,509 | B2 | 2/2016 | Markle et al. |
| 9,645,496 | B2 | 5/2017 | Markle |
| 10,133,193 | B2 * | 11/2018 | Coskun ............... G03F 7/70633 |
| 2006/0040191 | A1 * | 2/2006 | Okita .................... G03F 9/7003 |
| | | | 430/22 |
| 2009/0073448 | A1 | 3/2009 | Tenner et al. |
| 2013/0003029 | A1 | 1/2013 | Laidig |
| 2013/0054186 | A1 | 2/2013 | Den Boef |
| 2015/0235108 | A1 | 8/2015 | Pandev |
| 2015/0262606 | A1 * | 9/2015 | Xiao ...................... G11B 5/855 |
| | | | 428/210 |
| 2017/0069509 | A1 * | 3/2017 | Nelson .................. H01J 37/045 |

FOREIGN PATENT DOCUMENTS

WO 2015138130 A1 9/2015

OTHER PUBLICATIONS

International Search Report and Written Opinion for PCT/US2017/041152 dated Oct. 18, 2017.

* cited by examiner

*Primary Examiner* — Michelle M Iacoletti
(74) *Attorney, Agent, or Firm* — Patterson + Sheridan LLP

(57) ABSTRACT

Methods are provided and generally relate to adjusting exposure parameters of a substrate in response to an overlay error. The method includes partitioning the substrate into one or more sections. Each section corresponds to an image projection system. A total overlay error of a first layer deposited on the substrate is determined. For each section, a sectional overlay error is calculated. For each overlap area, in which two or more sections overlap, an average overlay error is calculated. The exposure parameters are adjusted in response to the total overlay error.

10 Claims, 9 Drawing Sheets

PIECEWISE ALIGNMENT MODELING METHOD

CROSS-REFERENCE TO RELATED APPLICATIONS

This application is a continuation application of U.S. application Ser. No. 15/644,284, filed Jul. 7, 2017, which claim priority to U.S. Provisional Application No. 62/364,230, filed Jul. 19, 2016, which are incorporated by reference in their entirety.

BACKGROUND

Field

Embodiments of the present disclosure generally relate to the field of maskless lithography. More specifically, embodiments provided herein relate to a system and method for adjusting exposure parameters of a substrate in response to an overlay error.

Description of the Related Art

Photolithography is widely used in the manufacturing of semiconductor devices and display devices, such as liquid crystal displays (LCDs). Large area substrates are often utilized in the manufacture of LCDs. LCDs, or flat panels, are commonly used for active matrix displays, such as computers, touch panel devices, personal digital assistants (PDAs), cell phones, television monitors, and the like. Generally, flat panels may include a layer of liquid crystal material forming pixels sandwiched between two plates. When power from the power supply is applied across the liquid crystal material, an amount of light passing through the liquid crystal material may be controlled at pixel locations enabling images to be generated.

Microlithography techniques are generally employed to create electrical features incorporated as part of the liquid crystal material layer forming the pixels. According to this technique, a light-sensitive photoresist is typically applied to at least one surface of the substrate. Then, a pattern generator exposes selected areas of the light-sensitive photoresist as part of a pattern with light to cause chemical changes to the photoresist in the selective areas to prepare these selective areas for subsequent material removal and/or material addition processes to create the electrical features.

In order to continue to provide display devices and other devices to consumers at the prices demanded by consumers, new apparatuses, approaches, and systems are needed to precisely and cost-effectively create patterns on substrates, such as large area substrates.

SUMMARY

Embodiments disclosed herein generally relate to adjusting exposure parameters of a substrate in response to an overlay error. The method includes partitioning the substrate into a plurality of sections. Each section corresponds to an image projection system. A total overlay error of a first layer deposited on the substrate is determined. For each section, a sectional overlay error is calculated. For each overlap area, in which two or more sections overlap, an average overlay error is calculated. The exposure parameters are adjusted in response to the total overlay error.

In another embodiment, a computer system for adjusting exposure parameters of a substrate in response to a total overlay error is disclosed herein. The computer system includes a processor and a memory. The memory stores instructions that when executed by the processor cause to processor to carry out a method of adjusting exposure parameters for a substrate in response to an overlay error. The method includes partitioning the substrate into a plurality of sections. Each section corresponds to an image projection system. A total overlay error of a first layer deposited on the substrate is determined. For each section, a sectional overlay error is calculated. For each overlap area, in which two or more sections overlap, an average overlay error is calculated. The exposure parameters are adjusted in response to the total overlay error.

In yet another embodiment, a non-transitory computer-readable medium is disclosed herein. The non-transitory computer-readable medium stores instructions that, when executed by a processor, cause a computer system to adjust exposure parameters of a substrate in response to an overlay error by performing steps of a method. The method includes partitioning the substrate into a plurality of sections. Each section corresponds to an image projection system. A total overlay error of a first layer deposited on the substrate is determined. For each section, a sectional overlay error is calculated. For each overlap area, in which two or more sections overlap, an average overlay error is calculated. The exposure parameters are adjusted in response to the total overlay error.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of this disclosure and are therefore not to be considered limiting of its scope, for the disclosure may be applied to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments disclosed herein generally relate to adjusting exposure parameters of a substrate in response to an overlay error. The method includes partitioning the substrate into one or more sections. Each section corresponds to an image projection system. A total overlay error of a first layer deposited on the substrate is determined. For each section, a sectional overlay error is calculated. For each overlay area, in which two or more sections overlap, an average overlay error is calculated. The exposure parameters are adjusted in response to the total overlay error.

The term "user" as used herein includes, for example, a person or entity that owns a computing device or wireless device; a person or entity that operates or utilizes a computing device or a wireless device; or a person or entity that is otherwise associated with a computing device or a wireless device. It is contemplated that the term "user" is not intended to be limiting and may include various examples beyond those described.

Figure 1:
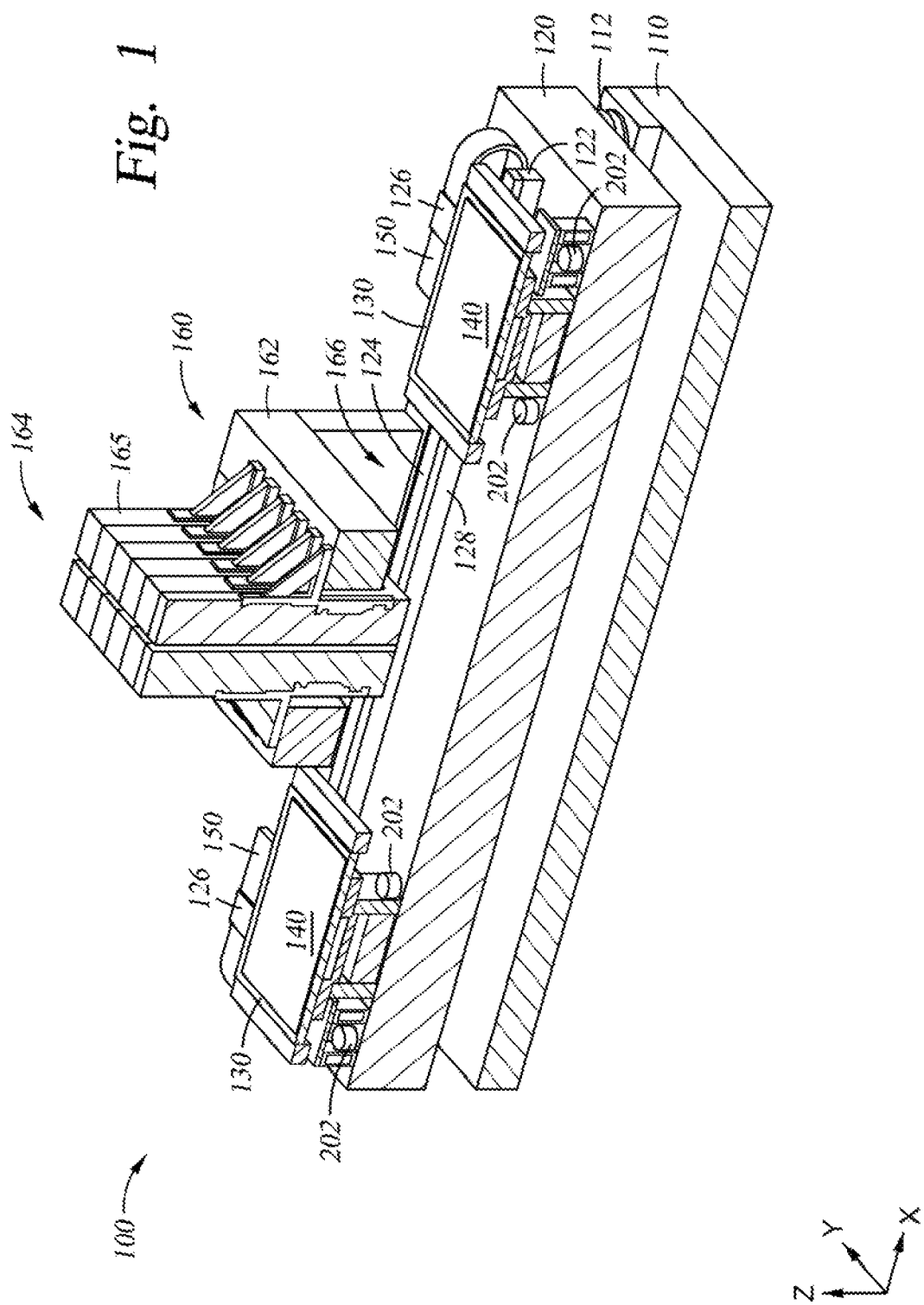
FIG. 1 is a perspective view of a system that may benefit from embodiments disclosed herein.

FIG. 1 is a perspective view of a system 100 that may benefit from embodiments disclosed herein. The system 100, shown in cross-section, includes a base frame 110, a slab 120, two or more stages 130, and a processing apparatus 160. In certain embodiments, one stage 130 may be used. The base frame 110 may rest on the floor of a fabrication facility and may support the slab 120. Passive air isolators 112 may be positioned between the base frame 110 and the slab 120. The slab 120 may be a monolithic piece of granite, and the two or more stages 130 may be disposed on the slab 120. A substrate 140 may be supported by each of the two or more stages 130. A plurality of holes (not shown) may be formed in the stage 130 for allowing a plurality of lift pins (not shown) to extend therethrough. The lift pins may rise to an extended position to receive the substrate 140, such as from a transfer robot (not shown). The transfer robot may position the substrate 140 on the lift pins, and the lift pins may thereafter gently lower the substrate 140 onto the stage 130.

The substrate 140 may, for example, be made of quartz and be used as part of a flat panel display. In other embodiments, the substrate 140 may be made of other materials. In some embodiments, the substrate 140 may have a photoresist layer formed thereon. A photoresist is sensitive to radiation and may be a positive photoresist or a negative photoresist, meaning that portions of the photoresist exposed to radiation will be respectively soluble or insoluble to a photoresist developer applied to the photoresist after the pattern is written into the photoresist. The chemical composition of the photoresist determines whether the photoresist will be a positive photoresist or negative photoresist. For example, the photoresist may include at least one of diazonaphthoquinone, a phenol formaldehyde resin, poly(methyl methacrylate), poly(methyl glutarimide), and SU-8. In this manner, the pattern may be created on a surface of the substrate 140 to form the electronic circuitry.

The system 100 may further include a pair of supports 122 and a pair of tracks 124. The pair of supports 122 may be disposed on the slab 120, and the slab 120 and the pair of supports 122 may be a single piece of material. The pair of tracks 124 may be supported by the pair of the supports 122, and the two or more stages 130 may move along the tracks 124 in the X-direction. In one embodiment, the pair of tracks 124 is a pair of parallel magnetic channels. As shown, each track 124 of the pair of tracks 124 is linear. In other embodiments, the track 124 may have a non-linear shape. An encoder 126 may be coupled to each stage 130 in order to provide location information to a controller 702 (See FIG. 7).

The processing apparatus 160 may include a support 162 and a processing unit 164. The support 162 may be disposed on the slab 120 and may include an opening 166 for the two or more stages 130 to pass under the processing unit 164. The processing unit 164 may be supported by the support 162. In one embodiment, the processing unit 164 is a pattern generator configured to expose a photoresist in a photolithography process. In some embodiments, the pattern generator may be configured to perform a maskless lithography process. The processing unit 164 may include a plurality of image projection systems (shown in FIG. 2) disposed in a case 165. The processing apparatus 160 may be utilized to perform maskless direct patterning. During operation, one of the two or more stages 130 moves in the X-direction from a loading position, as shown in FIG. 1, to a processing position. The processing position may refer to one or more positions of the stage 130 as the stage 130 passes under the processing unit 164. During operation, the two or more stages 130 may be lifted by a plurality of air bearings 200 and may move along the pair of tracks 124 from the loading position to the processing position. A plurality of vertical guide air bearings (not shown) may be coupled to each stage 130 and positioned adjacent an inner wall 128 of each support 122 in order to stabilize the movement of the stage 130. Each of the two or more stages 130 may also move in the Y-direction by moving along a track 150 for processing and/or indexing the substrate 140.

As shown, each stage 130 includes a plurality of air bearings 200 for lifting the stage 130. Each stage 130 may also include a motor coil (not shown) for moving the stage 130 along the tracks 124. The two or more stages 130 and the processing apparatus 160 may be enclosed by an enclosure (not shown) in order to provide temperature and pressure control.

Figure 2:
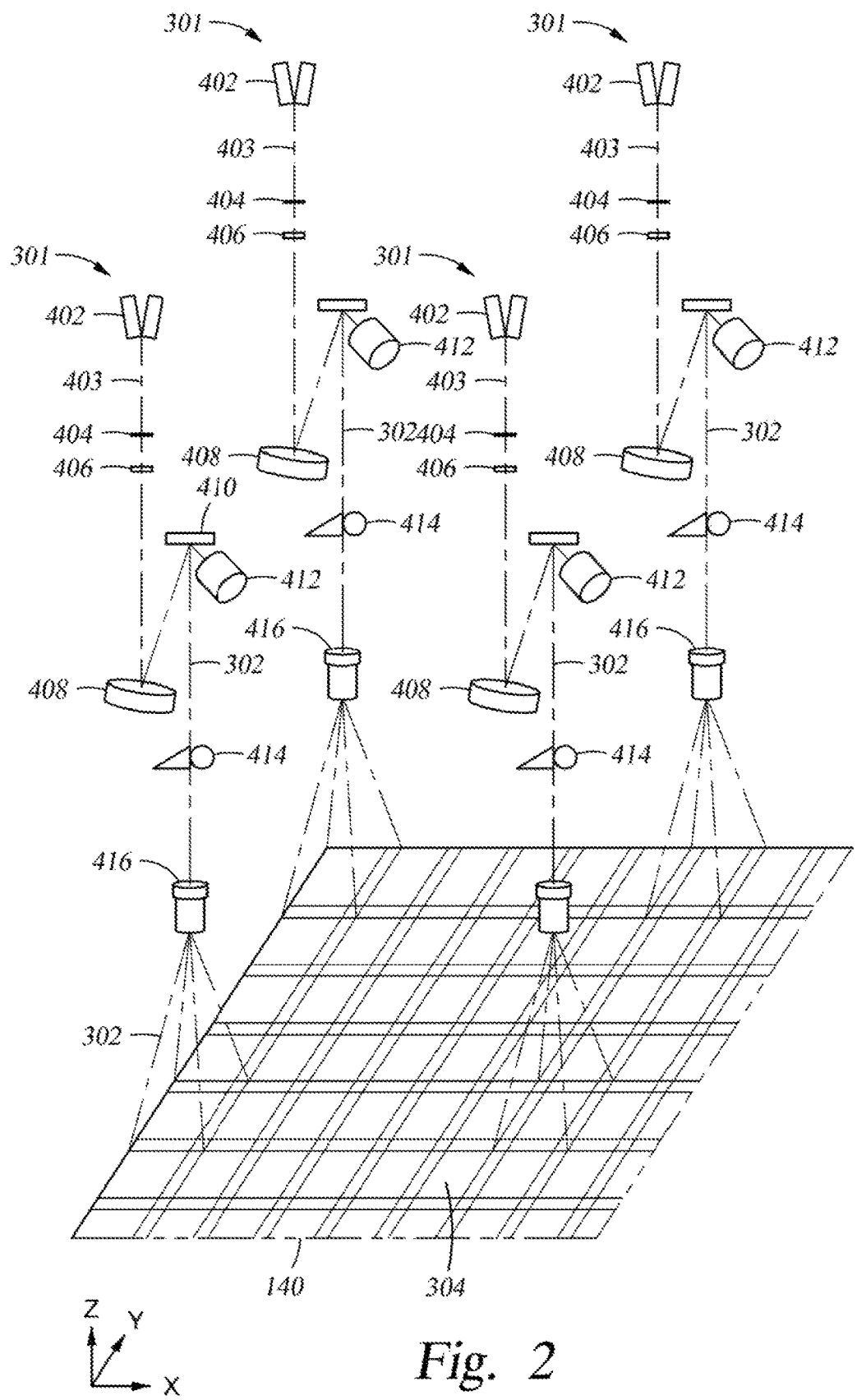
FIG. 2 is a perspective schematic view of a plurality of image projection systems, according to one embodiment.

FIG. 2 is a perspective schematic view of a plurality of image projection systems 301 according to one embodiment. As shown in FIG. 2, each image projection system 301 produces a plurality of write beams 302 onto a surface 304 of the substrate 140. As the substrate 140 moves in the X-direction and Y-direction, the entire surface 304 may be patterned by the write beams 302. The number of the image projection systems 301 may vary based on the size of the substrate 140 and/or the speed of stage 130. In one embodiment, there are 22 image projection systems 301 in the processing apparatus 160.

The image projection system 301 may include a light source 402, an aperture 404, a lens 406, a mirror 408, a DMD 410, a light dump 412, a camera 414, and a projection lens 416. The light source 402 may be a light emitting diode (LED) or a laser, and the light source 402 may be capable of producing a light having predetermined wavelength. In one embodiment, the predetermined wavelength is in the blue or near ultraviolet (UV) range, such as less than about 450 nm. The mirror 408 may be a spherical mirror. The projection lens 416 may be a 10× objective lens. The DMD 410 may include a plurality of mirrors, and the number of mirrors may correspond to the resolution of the projected image. In one embodiment, the DMD 410 includes 1920×1080 mirrors.

During operation, a beam 403 having a predetermined wavelength, such as a wavelength in the blue range, is produced by the light source 402. The beam 403 is reflected to the DMD 410 by the mirror 408. The DMD 410 includes a plurality of mirrors that may be controlled individually, and each mirror of the plurality of mirrors of the DMD 410 may be at "on" position or "off" position, based on the mask data provided to the DMD 410 by the controller (not shown). When the beam 403 reaches the mirrors of the DMD 410, the mirrors that are at "on" position reflect the beam 403, i.e., forming the plurality of write beams 302, to the projection lens 416. The projection lens 416 then projects the write beams 302 to the surface 304 of the substrate 140. The mirrors that are at "off" position reflect the beam 403 to the light dump 412 instead of the surface 304 of the substrate 140.

In one embodiment, the DMD 410 may have two or more mirrors. Each mirror may be disposed on a tilting mechanism, which may be disposed on a memory cell. The memory cell may be a CMOS SRAM. During operation, each mirror is controlled by loading the mask data into the memory cell. The mask data electrostatically controls the tilting of the mirror in a binary fashion. When the mirror is in a reset mode or without power applied, it may be set to a flat position, not corresponding to any binary number. Zero in binary may correspond to an "off" position, which means the mirror is tilted at −10 degrees, −12 degrees, or any other feasibly negative tilting degree. One in binary may correspond to an "on" position, which means the mirror is tilted at +10 degrees, +12 degrees, or any other feasibly positive tilting degree.

Figure 3:
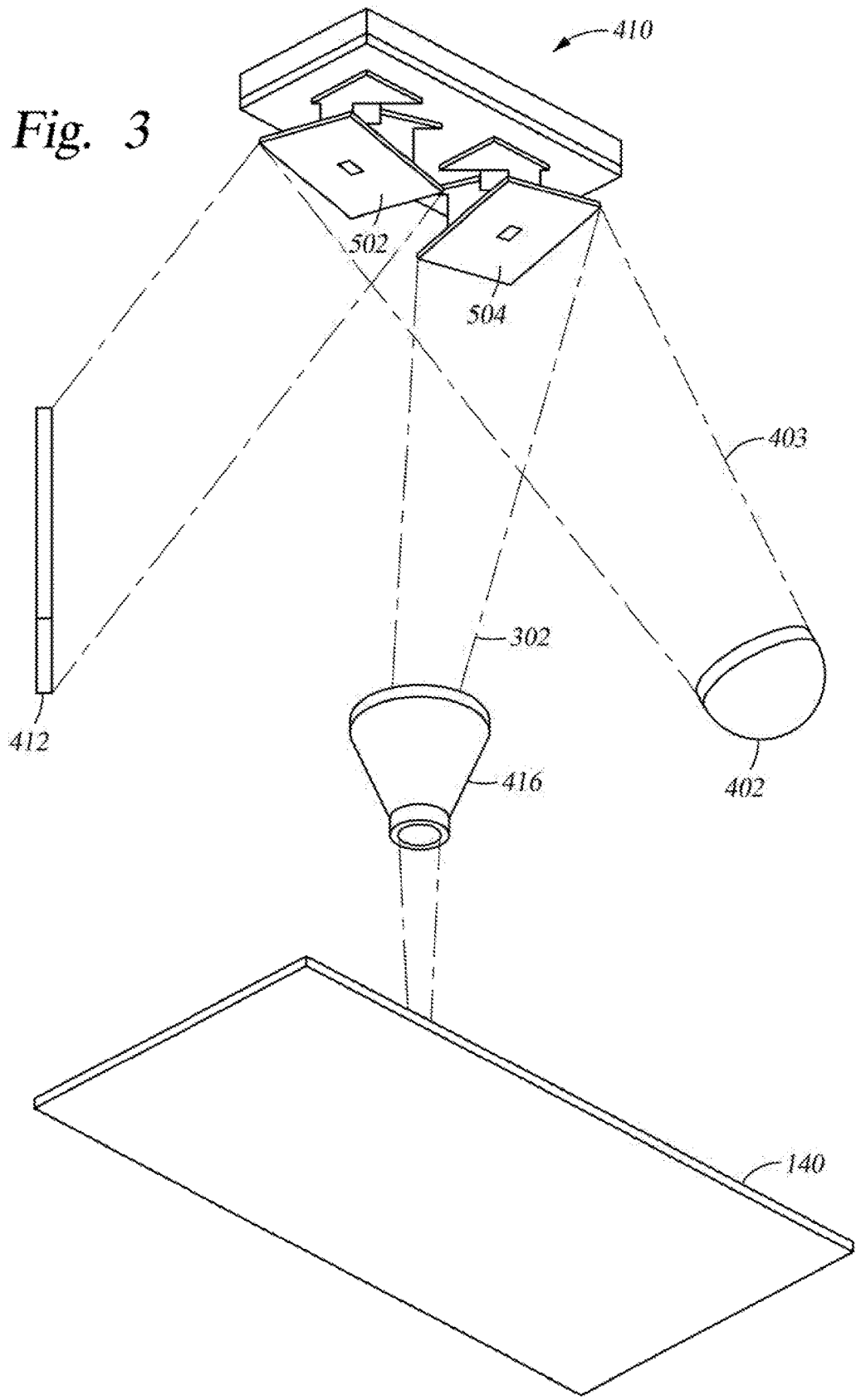
FIG. 3 schematically illustrates a beam being reflected by the two mirrors of the DMD, according to one embodiment.

FIG. 3 schematically illustrates the beam 403 being reflected by two mirrors 502, 504 of the DMD 410. As shown, the mirror 502, which is at "off" position, reflects the beam 403 generated from the light source 402 to the light dump 412. The mirror 504, which is at "on" position, forms the write beam 302 by reflecting the beam 403 to the projection lens 416.

Each system 100 may contain any number of image projection systems 301, and the number of image projection systems 301 may vary by system. In one embodiment there are 84 image projection systems 301. Each image projection system 301 may comprise 40 diodes, or any number of diodes. A problem arises when trying to maintain a large number of diodes as higher power is required to handle such large numbers of diodes. One solution may be to order the diodes in series; however, a need exists for the detection of a non-functioning diode when organized in a series as described below.

Figure 4:
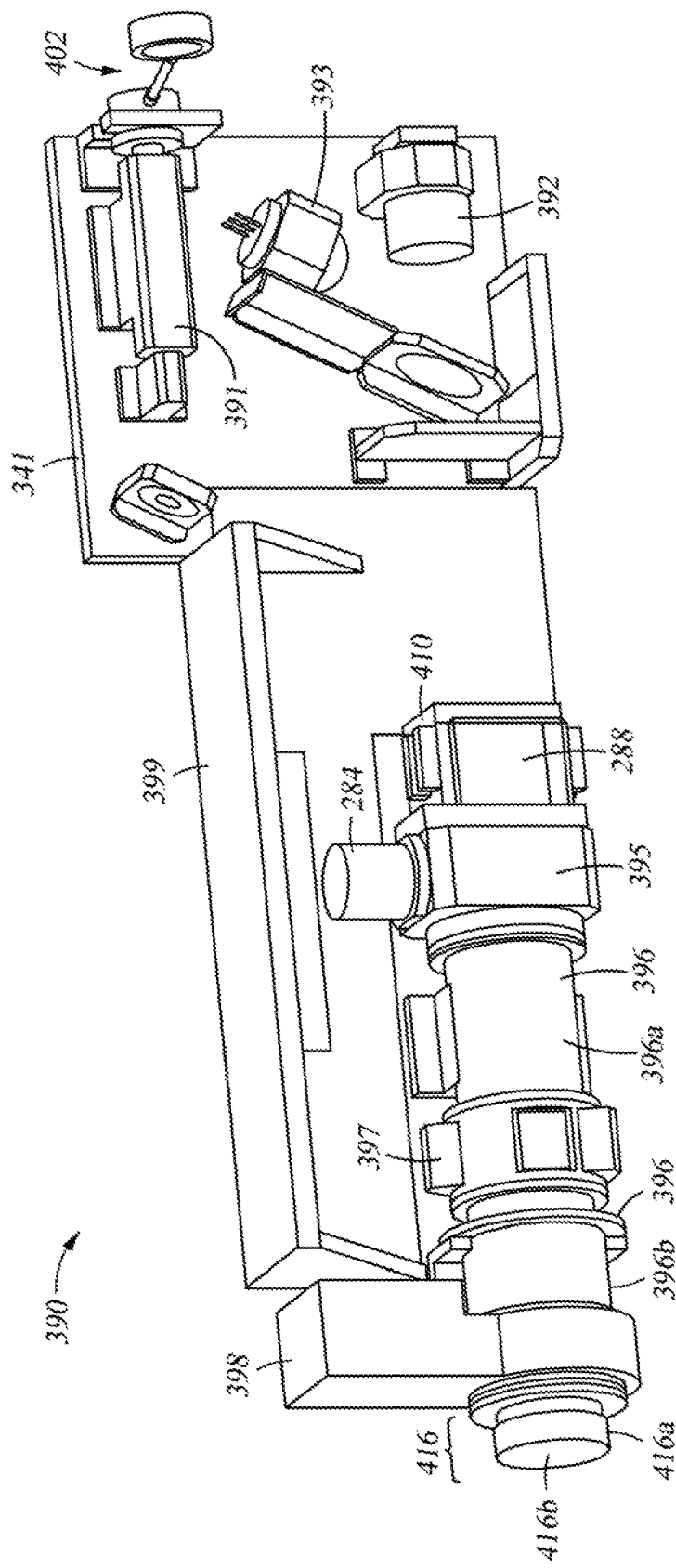
FIG. 4 is a perspective view of an image projection apparatus, according to one embodiment.

FIG. 4 is a perspective view of an image projection apparatus 390 according to one embodiment. The image projection apparatus 390 is used to focus light to a certain spot on a plane of a substrate 140 and to ultimately project an image onto that substrate 140. The image projection apparatus 390 includes two subsystems. The image projection apparatus 390 includes an illumination system and a projection system. The illumination system includes at least a light pipe 391 and a white light illumination device 392. The projection system includes at least a DMD 410, a frustrated prism assembly 288, a beamsplitter 395, one or more parts of projection optics 396a, 396b, a distortion compensator 397, a focus motor 398 and a projection lens 416 (discussed supra). The projection lens 416 includes a focus group 416a and a window 416b.

Light is introduced to the image projection apparatus 390 from the light source 402. The light source 402 may be an actinic light source. For example, the light source 402 may be a bundle of fibers, each fiber containing one laser. In one embodiment, the light source 402 may be a bundle of about 100 fibers. The bundle of fibers may be illuminated by laser diodes. The light source 402 is coupled to the light pipe (or kaleido) 391. In one embodiment, the light source 402 is coupled to the light pipe 391 through a combiner, which combines each of the fibers of the bundle.

Once light from the light source 402 enters into the light pipe 391, the light bounces around inside the light pipe 391 such that the light is homogenized and uniform when it exits the light pipe 391. In one example, the light may bounce in the light pipe 391 six or seven times. In other words, the light goes through six to seven total internal reflections within the light pipe 391, which results in the output of uniform light.

The image projection apparatus 390 may optionally include various reflective surfaces (not labeled). The various reflective surfaces capture some of the light traveling through the image projection apparatus 390. In one embodiment, the various reflective surfaces may capture some light and then help direct the light to a light level sensor 393 so that the laser level may be monitored.

The white light illumination device 392 projects broad-band visible light, into the projection system of image projection apparatus 390. Specifically, the white light illumination device 392 directs the light to the frustrated prism assembly. The actinic and broad-band light sources may be turned on and off independently of one another.

The frustrated prism assembly 288 functions to deliver the light that will be projected onto the surface of the substrate 140. Use of the frustrated prism assembly 288 results in minimum energy loss because the total internal reflected light goes out. The frustrated prism assembly 288 is coupled to a beamsplitter 395.

A DMD 410 is included as part of the frustrated cube assembly. The DMD 410 is the pattern generating device of the image projection apparatus 390. Use of the DMD 410 and frustrated prism assembly 288 help to minimize the footprint of each image projection apparatus 390 by keeping the direction of the flow of illumination roughly normal to the substrate 140 all the way from the light source 402 that generates the exposure illumination to the substrate focal plane.

The beamsplitter 395 is used to further extract part of light reflected from substrate 140 for alignment. More specifically, the beamsplitter 395 is used to split the light into two separate beams. The beamsplitter 395 is coupled to the projection optics 396. Two parts of projection optics 396a, 396b are shown in FIG. 4.

In one embodiment, a focus sensor and camera 284 is attached to the beamsplitter 395. The focus sensor and camera 284 may be configured to monitor various aspects of the imaging quality of the image projection apparatus 390, including, but not limited to, through lens focus and alignment, as well as mirror tilt angle variation. Additionally, the focus sensor and camera 284 may show the image, which is going to be projected onto the substrate 140. In further embodiments, the focus sensor and camera 284 may be used to capture images on the substrate 140 and make a comparison between those images. In other words, the focus sensor and camera 284 may be used to perform inspection functions.

Together the projection optics 396, the distortion compensator 397, the focus motor 398, and the projection lens 416 prepare for and ultimately project the pattern from the DMD 410 onto the substrate 140. Projection optics 396a is coupled to the distortion compensator 397. The distortion compensator 397 is coupled to projection optics 396b, which is coupled to the focus motor 398. The focus motor 398 is coupled to the projection lens 416. The projection lens 416 includes a focus group 416a and a window 416b. The focus group 416a is coupled to the window 416b. The window 416b may be replaceable.

The light pipe 391 and white light illumination device 392 are coupled to a first mounting plate 341. Additionally, in embodiments including additional various reflective surfaces (not labeled) and a light level sensor 393, the various reflective surfaces and the light level sensor 393 may also be coupled to the first mounting plate 341.

The frustrated prism assembly 288, beamsplitter 395, one or more projection optics parts 396a, 396b and distortion compensator 397 are coupled to a second mounting plate 399. The first mounting plate 341 and the second mounting plate 399 are planar, which allows for precise alignment of the aforementioned components of the image projection apparatus 390. In other words, light travels through the image projection apparatus 390 along a single optical axis. This precise alignment along a single optical axis results in an apparatus that is compact. For example, the image projection apparatus 390 may have a thickness of between about 80 mm and about 100 mm.

Figure 5:
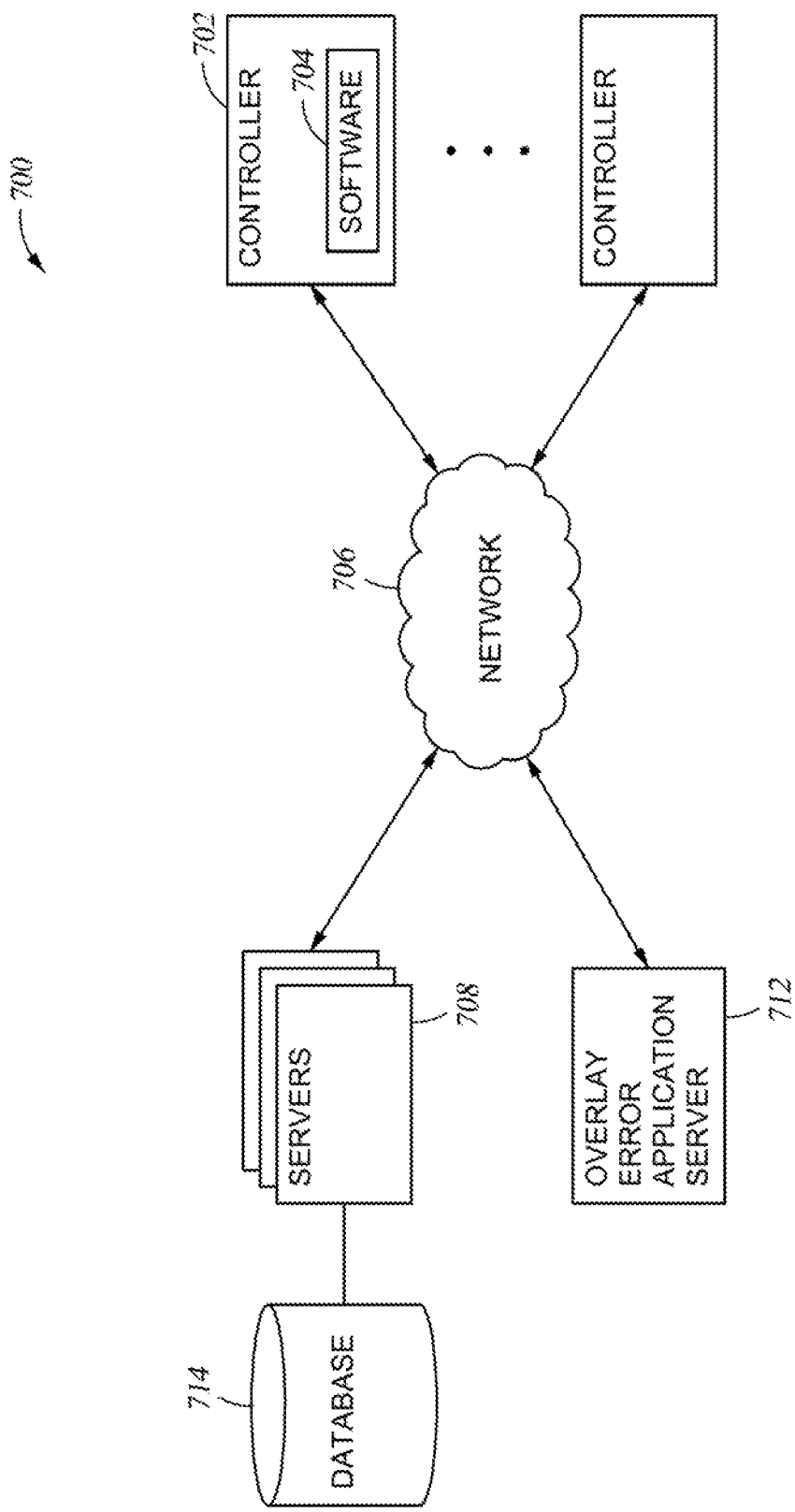
FIG. 5 illustrates a computer system, according to one embodiment.

FIG. 5 illustrates a computing system 700, according to one embodiment. As shown, the computing system 700 may include a plurality of servers 708, an overlay error application server 712, and a plurality of controllers (i.e., computers, personal computers, mobile/wireless devices) 702 (only two of which are shown for clarity), each connected to a communications network 706 (for example, the Internet). The servers 708 may communicate with the database 714 via a local connection (for example, a Storage Area Network (SAN) or Network Attached Storage (NAS)) or over the Internet. The servers 708 are configured to either directly access data included in the database 714 or to interface with a database manager that is configured to manage data included within the database 714.

Each controller 702 may include conventional components of a computing device, for example, a processor, system memory, a hard disk drive, a battery, input devices such as a mouse and a keyboard, and/or output devices such as a monitor or graphical user interface, and/or a combination input/output device such as a touchscreen which not only receives input but also displays output. Each server 708 and the overlay error application server 712 may include a processor and a system memory (not shown), and may be configured to manage content stored in database 714 using, for example, relational database software and/or a file system. The servers 708 may be programmed to communicate with one another, the controllers 702, and the overlay error application server 712 using a network protocol such as, for example, the TCP/IP protocol. The overlay error application server 712 may communicate directly with the controllers 702 through the communications network 706. The controllers 702 are programmed to execute software 704, such as programs and/or other software applications, and access applications managed by servers 708.

In the embodiments described below, users may respectively operate the controllers 702 that may be connected to the servers 708 over the communications network 706. Pages, images, data, documents, and the like may be displayed to a user via the controllers 702. Information and images may be displayed through a display device and/or a graphical user interface in communication with the controller 702.

It is noted that the controller 702 may be a personal computer, laptop mobile computing device, smart phone, video game console, home digital media player, network-connected television, set top box, and/or other computing devices having components suitable for communicating with the communications network 706 and/or the required applications or software. The controller 702 may also execute other software applications configured to receive content and information from the substrate alignment application server 712.

Figure 6:
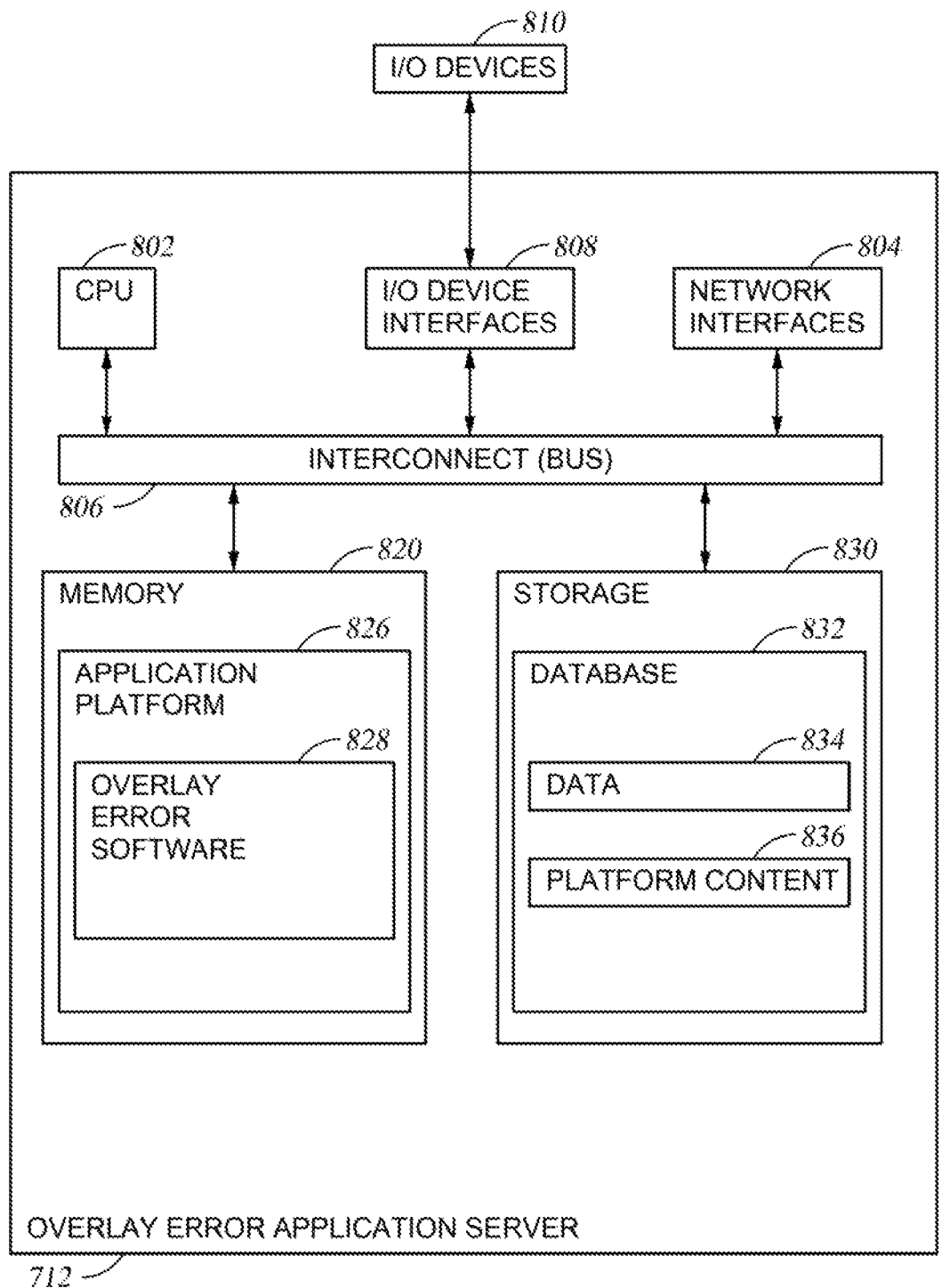
FIG. 6 illustrates a more detailed view of a server of FIG. 5, according to one embodiment.

FIG. 6 illustrates a more detailed view of the overlay error application server 712 of FIG. 5. The overlay error application server 712 includes, without limitation, a central processing unit (CPU) 802, a network interface 804, memory 820, and storage 830 communicating via an interconnect 806. The overlay error application server 712 may also include I/O device interfaces 808 connecting I/O devices 810 (for example, keyboard, video, mouse, audio, touchscreen, etc.). The overlay error application server 712 may further include the network interface 804 configured to transmit data via the communications network 706.

The CPU 802 retrieves and executes programming instructions stored in the memory 820 and generally controls and coordinates operations of other system components. Similarly, the CPU 802 stores and retrieves application data residing in the memory 820. The CPU 802 is included to be representative of a single CPU, multiple CPU's, a single CPU having multiple processing cores, and the like. The interconnect 806 is used to transmit programming instructions and application data between the CPU 802, I/O device interfaces 808, storage 830, network interfaces 804, and memory 820.

The memory 820 is generally included to be representative of a random access memory and, in operation, stores software applications and data for use by the CPU 802. Although shown as a single unit, the storage 830 may be a combination of fixed and/or removable storage devices, such as fixed disk drives, floppy disk drives, hard disk drives, flash memory storage drives, tape drives, removable memory cards, CD-ROM, DVD-ROM, Blu-Ray, HD-DVD, optical storage, network attached storage (NAS), cloud storage, or a storage area-network (SAN) configured to store non-volatile data.

The memory 820 may store instructions and logic for executing an application platform 826 which may include overlay error software 828. The storage 830 may include a database 832 configured to store data 834 and associated application platform content 836. The database 832 may be any type of storage device.

Network computers are another type of computer system that can be used in conjunction with the disclosures provided herein. Network computers do not usually include a hard disk or other mass storage, and the executable programs are loaded from a network connection into the memory 820 for execution by the CPU 802. A typical computer system will usually include at least a processor, memory, and an interconnect coupling the memory to the processor.

Figure 7:
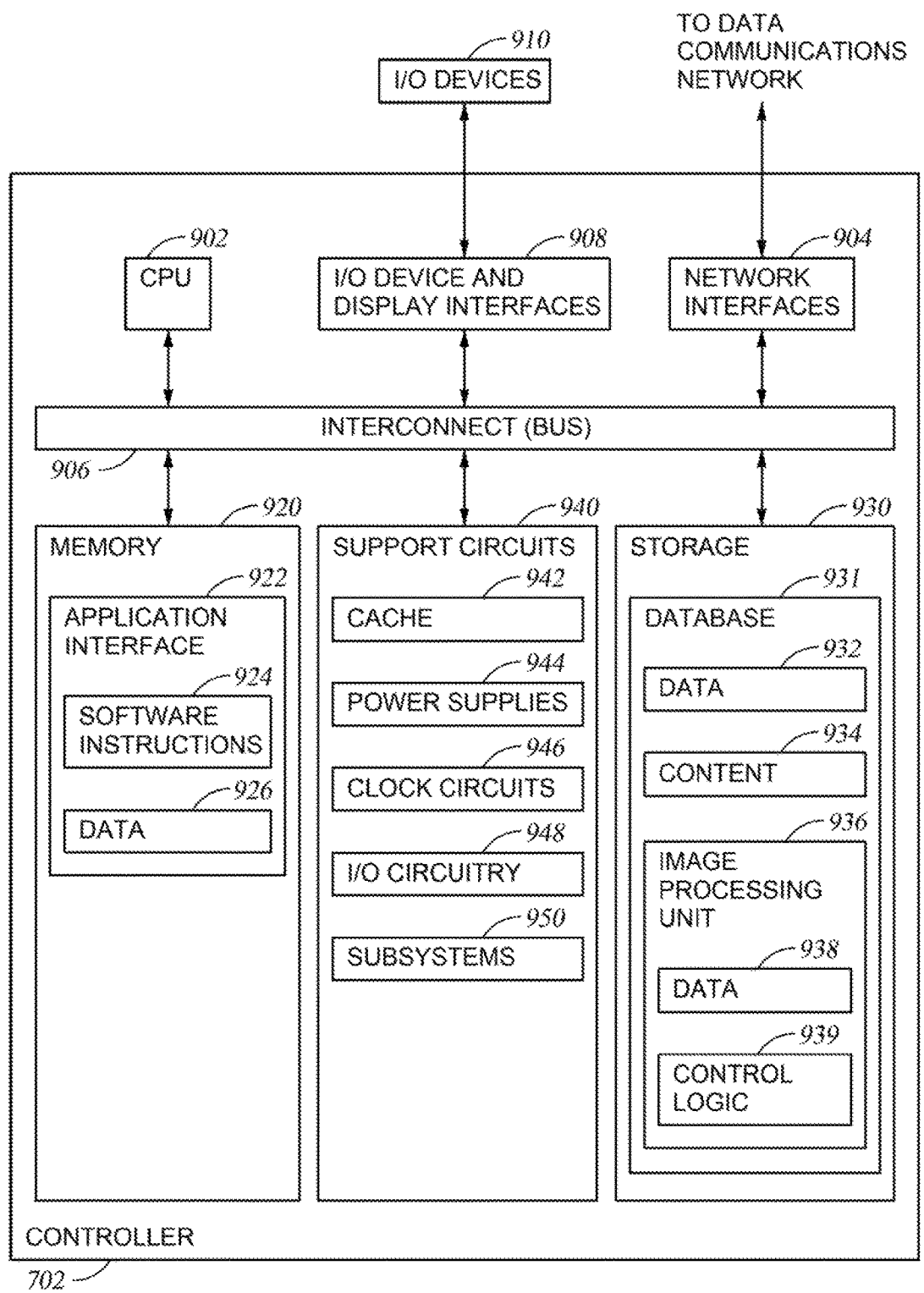
FIG. 7 illustrates a controller computing system, according to one embodiment.

FIG. 7 illustrates a controller 702 used to access the overlay error application server 712 and retrieve or display data associated with the application platform 826. The controller 702 may include, without limitation, a central processing unit (CPU) 902, a network interface 904, an interconnect 906, a memory 920, storage 930, and support circuits 940. The controller 702 may also include an I/O device interface 908 connecting I/O devices 910 (for example, keyboard, display, touchscreen, and mouse devices) to the controller 702.

Like CPU 802, CPU 902 is included to be representative of a single CPU, multiple CPU's, a single CPU having multiple processing cores, etc., and the memory 920 is generally included to be representative of a random access memory. The interconnect 906 may be used to transmit programming instructions and application data between the CPU 902, I/O device interfaces 908, storage 930, network interface 904, and memory 920. The network interface 904 may be configured to transmit data via the communications network 706, for example, to transfer content from the surface alignment application server 712. Storage 930, such as a hard disk drive or solid-state storage drive (SSD), may store non-volatile data. The storage 930 may contain a database 931. The database 931 may contain data 932 and other content 934. In some embodiments, the database 931 may further include an image processing unit 936. The image processing unit may include data 938 and/or control logic 939. Illustratively, the memory 920 may include an application interface 922, which itself may display software instructions 924, and/or store or display data 926. The application interface 922 may provide one or more software applications which allow the controller 702 to access data and other content hosted by the surface alignment application server 712.

The controller 702 may be coupled to or in communication with one or more of the processing apparatus 160, the stages 130, and the encoder 126. The processing apparatus 160 and the stages 130 may provide information to the controller 702 regarding the substrate processing and the substrate aligning. For example, the processing apparatus 160 may provide information to the controller 702 to alert the controller that substrate processing has been completed. The encoder 126 may provide location information to the controller 702, and the location information is then used to control the stages 130 and the processing apparatus 160.

The controller 702 may include a central processing unit (CPU) 902, memory 920, and support circuits 940 (or I/O 908). The CPU 902 may be one of any form of computer processors that are used in industrial settings for controlling various processes and hardware (e.g., pattern generators, motors, and other hardware) and monitor the processes (e.g., processing time and substrate position). The memory 920, as shown in FIG. 7, is connected to the CPU 902, and may be one or more of a readily available memory, such as random access memory (RAM), read only memory (ROM), floppy disk, hard disk, or any other form of digital storage, local or remote. Software instructions and data can be coded and stored within the memory for instructing the CPU 902. The support circuits 940 are also connected to the CPU 902 for supporting the processor in a conventional manner. The support circuits 940 may include conventional cache 942, power supplies 944, clock circuits 946, input/output circuitry 948, subsystems 950, and the like. A program (or computer instructions) readable by the controller 702 determines which tasks are performable on a substrate. The program may be software readable by the controller 702 and may include code to monitor and control, for example, the processing time and substrate position.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

The present example also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, read-only memories (ROMs), random access memories (RAMs), EPROMs, EEPROMs, flash memory, magnetic or optical cards, any type of disk including floppy disks, optical disks, CD-ROMs, and magnetic-optical disks, or any type of media suitable for storing electronic instructions, and each coupled to a computer system interconnect.

The algorithms and displays presented herein are not inherently related to any particular computer or other apparatus. Various general purpose systems may be used with programs in accordance with the teachings herein, or it may prove convenient to construct a more specialized apparatus to perform the required method operations. The structure for a variety of these systems will appear from the description above. In addition, the present examples are not described with reference to any particular programming language, and various examples may thus be implemented using a variety of programming languages.

As described in greater detail within, embodiments of the disclosure provide a software application through which line wave defects of exposure polygons are corrected for at forbidden angles by dithering the edges of those features at the forbidden angles to reduce edge placement errors during maskless lithography patterning in a manufacturing process.

In one embodiment, a method 1000 for adjusting exposure parameters in response to a total overlay area is disclosed. The method 1000 may be performed by a controller 702, as shown in and discussed with relation to FIG. 7, supra. The CPU 902 is programmed to execute overlay error software 828 stored in memory 820, which implements the method 1000 for adjusting exposure parameters in response to a total overlay area described in conjunction with FIG. 8, infra.

Figure 8:
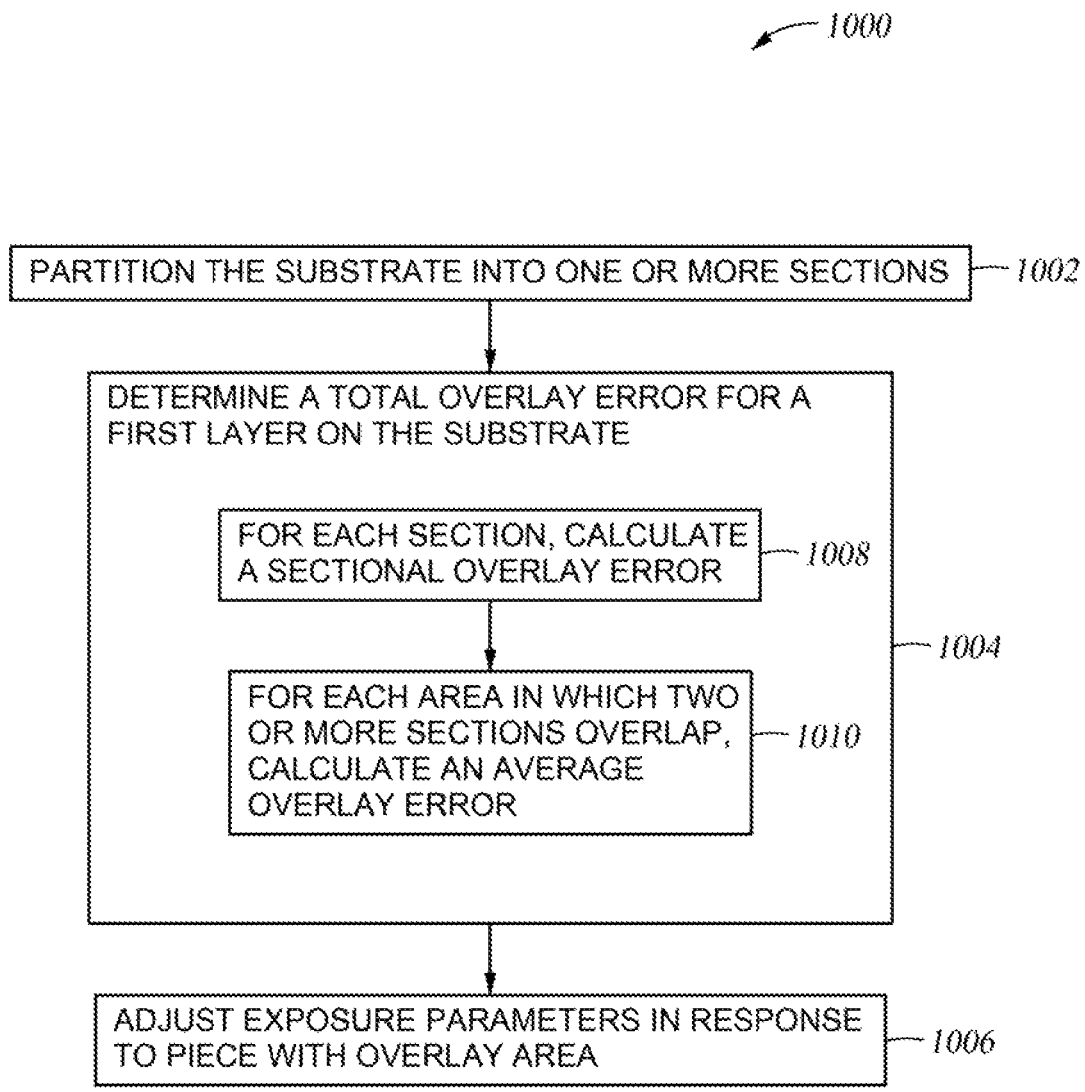
FIG. 8 schematically illustrates operations of a method for adjusting exposure parameters of a substrate in response to an overlay error.
Figure 9:
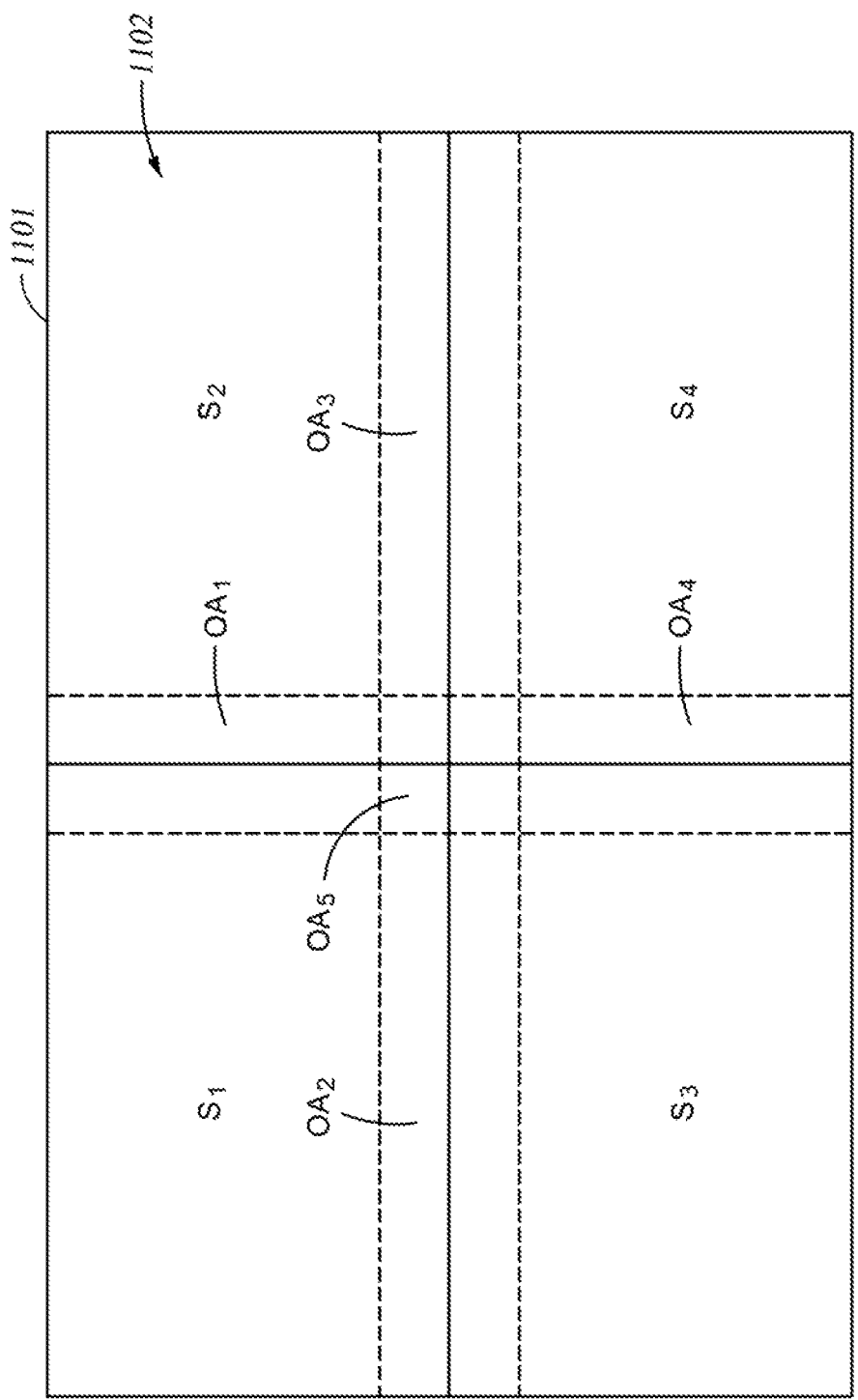
FIG. 9 illustrates a top view of a substrate having a first layer deposited thereon, according to one embodiment.

FIG. 8 schematically illustrates operations of a method 1000 for adjusting exposure parameters in response to a total overlay area, as shown in FIG. 9. The method 1000 generally relates to determining a total overlay error of a first layer deposited on the substrate and adjusting exposure parameters in response to the total overlay error. Between one layer and the next layer that overlays the previous one, the individual patterns of the one layer and the next layer must be aligned. However, due to pattern and material differences in the multiple overlying layers, film stress and/or topography variations (or pattern related differences) between layers is inevitable. The generated film stress between the layers formed on the substrate will cause the substrate to deform, which affects the lithographic patterning process results which can lead to device yield issues for the semiconductor devices formed on the substrate. Overlay errors of the device structure may originate from different error sources. One of the sources commonly seen in the field is substrate film layer deformation caused by film stress, substrate curvature and the like. Film stress, substrate curvature, substrate deformation, or surface topography variations of the device structure on the substrate may also result in displacement or misalignment of the lithographic patterns formed from one layer to the next, which may be detrimental to device yield results and/or cause variation in device performance. What begins as an ideal rectangular shape may result in a "pin-cushion" shape wherein the substrate is pulled in various directions, no longer maintaining an ideal rectangular shape. When there is substrate warpage, the original center, C, may shift to center, C'. Thus, a given point (x,y) with respect to center, C, may correspond to point (x',y'). Therefore, in order to align a subsequent layer on top of the first layer, a system needs to account for the total overlay error.

The method 1000 begins at operation 1002. At operation 1002, a surface 1102 of the substrate 1101 is partitioned into one or more sections, $S_k$. The one or more sections $S_k$ correspond to one or more image projection systems 301 in the system 100. For example, given n image projection systems 301, the substrate 1101 will be partitioned into n sections, $S_n$. In the present example, the substrate 1101 is partitioned into four sections $S_1$-$S_4$ corresponding to a two-by-two image projection system 301 arrangement. Partitioning the substrate 1101 into one or more sections $S_k$ allows for a more accurate reading of the overlay error. This is because a single best fit line may not suffice for complicated distortion patterns on substrates. Partitioning the substrate allows for a best fit line to be applied to a smaller distortion area, thus providing a more accurate reading of the total distortion pattern. When the substrate 1101 is partitioned into sections, an origin (0,0) for each section is determined. This allows the system to more easily determine the center C of the each section $S_1$-$S_4$, in subsequent calculations.

At operation 1004, a total overlay error of the first layer deposited on the substrate is determined. Determining the total overlay error includes determining a sectional overlay error for each section $S_k$ (sub-operation 1008) and determining an overlap overlay error for areas where two or more sections $S_k$ overlap (sub-operation 1010).

At sub-operation 1008 the sectional overlay error is determined for each section, $S_k$. The sectional overlay error is determined by first scanning the top surface of the first layer deposited on the substrate to determine an amount of distortion in each section $S_k$. The distortion pattern is fit with a trend line to determine a shift in coordinates. For example, given a distortion having a linear pattern, a linear trend line may be used to determine how to adjust process parameters for subsequent exposures. In another example, given a distortion having a curved distortion, a polynomial trend line may be used to determine how to adjust process parameters for subsequent exposures. Generally, the trend line represents a polynomial that will transfer each original coordinate (x,y) in the original process parameters to a modified coordinate (x',y') in the modified process parameters to account for the overlay error. Generally, this may be represented as:

$$x' = x + \sum_{k=1}^{G} \sigma_{xk} S_k(x, y) + \sum_{l=0}^{H} \rho_{xl} P_l(x, y) \quad \text{Equation 1}$$

$$y' = y + \sum_{k=1}^{G} \sigma_{yk} S_k(x, y) + \sum_{l=0}^{H} \rho_{yl} P_l(x, y) \quad \text{Equation 2}$$

where Equation 1 represents the shift in coordinates in the x-direction and Equation 2 represents the shift in coordinates in the y-direction. Equations 1 and 2 are broken up into three components: the original point (x or y), $\Sigma_{k=1}^{G}\sigma_{xk}S_k(x,y)$, and $\Sigma_{l=0}^{H}\rho_{xl}P_l(x,y)$. $S_k(x,y)$ represents a given section, K, where $S_k(x,y)$ is a piecewise function, and may be represented as:

$$S_k(x, y) = \begin{cases} 1 \text{ if } (x, y) \in S_k \\ 0 \end{cases} \quad \text{Equation 3}$$

The piecewise function $S_k(x,y)$ forces $\Sigma_{k=1}^{G}\sigma_{xk}S_k(x,y)$ to zero provided that the point is not in section $S_k$. As such, Equation 3 ensures that that only points in a respective section are shifted by the polynomial representing the best fit line for that section. Other sections may exhibit a distortion pattern in which a different best fit line is used. Accordingly, Equations 1 and 2 may not be equivalent for each section.

At sub-operation 1010, an overlap overlay error is determined. The overlap overlay error is determined in those areas in which two or more sections $S_k$ overlap. As shown in FIG. 9, overlap areas $OA_1$-$OA_S$ are areas in which two or more sections $S_k$ overlap. To determine the overlay error in given overlap area $OA_k$, the sectional overlay error of the sections resulting in the overlap area $OA_k$ are averaged. The shift in the x-direction may be represented by Equation 4 and the shift in the y-direction may be Equation 5.

$$x' = x + \sum_{k=1}^{G} \sigma_{xk} OA_k(x, y) + \sum_{l=0}^{H} \rho_{xl} P_l(x, y) \quad \text{Equation 4}$$

$$y' = y + \sum_{k=1}^{G} \sigma_{yk} OA_k(x, y) + \sum_{l=0}^{H} \rho_{yl} P_l(x, y) \quad \text{Equation 5}$$

The overlap area is represented by $OA_k(x,y)$, where $OA_k(x,y)$ is a piecewise equation represented by Equation 6 below.

$$OA_k(x, y) \begin{cases} w_k(x, y) \text{ if } (x, y) \in \bigcap_{m=1}^{K} S_m \\ 0 \end{cases} \quad \text{Equation 6}$$

In Equation 6, $OA_k(x,y)$ represents a function $w_k(x,y)$ provided that the point (x,y) is an element in the intersection of at least two sections $s_v, s_w$ where $s_v, s_w \in S_k$. If the point (x,y) is in an overlap area, the function $w_k(x,y)$ is substituted into Equations 4 and 5 for $OA_k(x,y)$, where $w_k(x,y)$ is represented as:

$$w_k(x, y) = \frac{\frac{1}{\sqrt{(cx_k - x)^2 + (cy_k - y)^2}}}{\sum_{i}^{G} \frac{1}{\sqrt{(cx_i - x)^2 + (cy_i - y)^2}}} \quad \text{Equation 7}$$

where $(cx_k, cy_k)$ defines a center of each section $S_k$.

After calculating the shift in x and y for each point in each section $S_k$, as well as all overlap areas $OA_k$, at operation 1006 the exposure parameters are adjusted in response to the total overlay error determined in operation 1010. For each point in each section $S_k$, each point (x,y) is shifted to (x',y') in accordance with equations 1 and 2. For each point in each overlap area $OA_k$, each point (x,y) is shifted to (x',y') in accordance with Equations 4 and 5. By taking into account the overlap areas $OA_k$, method 1000 allows for a smooth transition between adjacent sections $S_k$. The smooth transitions mitigate the overlay error that may occur due to abrupt changes between adjacent sections $S_k$ in the first layer.

While the foregoing is directed to embodiments described herein, other and further embodiments may be devised without departing from the basic scope thereof. For example, aspects of the present disclosure may be implemented in hardware or software or in a combination of hardware and software. One embodiment described herein may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (for example, read-only memory devices within a computer such as CD-ROM disks readable by a CD-ROM drive, flash memory, ROM chips or any type of solid-state non-volatile semiconductor memory) on which information is permanently stored; and (ii) writable storage media (for example, floppy disks within a diskette drive or hard-disk drive or any type of solid-state random-access semiconductor memory) on which alterable information is stored. Such computer-readable storage media, when carrying computer-readable instructions that direct the functions of the disclosed embodiments, are embodiments of the present disclosure.

It will be appreciated to those skilled in the art that the preceding examples are exemplary and not limiting. It is intended that all permutations, enhancements, equivalents, and improvements thereto that are apparent to those skilled in the art upon a reading of the specification and a study of the drawings are included within the true spirit and scope of the present disclosure. It is therefore intended that the following appended claims include all such modifications, permutations, and equivalents as fall within the true spirit and scope of these teachings.

What is claimed is:

1. A method of adjusting exposure parameters of a substrate in response to an overlay error, comprising:
   positioning the substrate on a support, wherein the substrate comprises a plurality of sections;
   determining an overlay error of a layer on the substrate, comprising:
      for each overlap area in which two or more sections overlap, calculating an average overlay error; and
      for each section, measuring an amount of distortion in the respective section using a trend line; and
   adjusting exposure parameters in response to the determined overlay error.

2. The method of claim 1, wherein for each overlap area in which two or more sections overlap, calculating an average overlay error, comprises:
   scanning a top surface of the layer in a first section extending into an overlap area in which the first section and a second section overlap;
   scanning the top surface of the layer in the second section extending into the overlap area;
   calculating a first sectional overlay error for the first section by measuring a first amount of distortion using a first trend line;
   calculating a second sectional overlay error for the second section by measuring a second amount of distortion using a second trend line; and
   averaging the first sectional overlay error and the second sectional overlay error.

3. The method of claim 2, wherein adjusting exposure parameters in response to the overlay error, comprises:
   shifting each coordinate in the overlap area based on the average overlay error.

4. A method of adjusting exposure parameters of a substrate in response to an overlay error, comprising:
   determining a total overlay error of a layer on the substrate, wherein the substrate comprises a plurality of sections; and
   adjusting exposure parameters in response to the total overlay error,
   wherein determining a total overlay error of a layer of the substrate comprises for each overlap area in which two or more sections overlap, calculating an average overlay error and for each section, calculating a sectional overlay error.

5. The method of claim 4, wherein for each section, calculating a sectional overlay error, comprises:
   scanning a top surface of the layer; and
   measuring an amount of distortion in the respective section using a trend line.

6. The method of claim 5, wherein adjusting exposure parameters in response to the total overlay error, comprises:
   shifting each coordinate in the section based on the calculated sectional overlay error.

7. The method of claim 4, wherein for each overlap area in which two or more section overlap, calculating an average overlay error, comprises:
   scanning a top surface of the layer in a first section extending into an overlap area in which the first section and a second section overlap;
   scanning the top surface of the layer in the second section extending into the overlap area;
   calculating a first sectional overlay error for the first section by measuring a first amount of distortion using a first trend line;
   calculating a second sectional overlay error for the second section by measuring a second amount of distortion using a second trend line; and
   averaging the first sectional overlay error and the second sectional overlay error.

8. The method of claim 7, wherein adjusting exposure parameters in response to the total overlay error, comprises:
   shifting each coordinate in the overlap area based on the average overlay error.

9. A computer system for adjusting exposure parameters of a substrate in response to an overlay error, comprising:
   a processor; and
   a memory storing instructions that, when executed by the processor, cause the computer system to:
      determine a total overlay error of a layer on the substrate, wherein the substrate comprises a plurality of sections; and
      adjust exposure parameters in response to the total overlay error,
         wherein the instructions, when causing the computer system to determine a total overlay error of the layer on the substrate, cause the computer system to calculate an average overlay error for each overlap area in which two or more sections overlap and calculate a sectional overlay error for each section.

10. The computer system of claim 9, wherein the instructions, when causing the computer system to calculate an average overlay error for each overlap area in which two or more section overlap, cause the computer system to:
   scan a top surface of the layer in a first section extending into the overlap area;
   scan the top surface of the layer in a second section extending into the overlap area;
   calculate a first sectional overlay error for the first section by measuring a first amount of distortion using a first trend line;
   calculate a second sectional overlay error for the second section by measuring a second amount of distortion using a second trend line; and
   average the first sectional overlay error and the second sectional overlay error.

* * * * *

UNITED STATES PATENT AND TRADEMARK OFFICE
CERTIFICATE OF CORRECTION

PATENT NO. : 10,495,983 B2
APPLICATION NO. : 16/146951
DATED : December 3, 2019
INVENTOR(S) : Tamer Coskun et al.

Page 1 of 1

It is certified that error appears in the above-identified patent and that said Letters Patent is hereby corrected as shown below:

In the Specification

In Column 11, Line 53, delete "$\Sigma_{l=0}^{H}\rho_{xl}P_l(x,y)$." and insert -- $\sum_{l=0}^{H} \rho_{xl} P_l(x,y).$ --, therefor.

In Column 11, Line 61, delete "$\sigma_{xk}$" and insert -- $\sigma_{yk}$ --, therefor.

In Column 12, Line 4, delete "-OA$_s$" and insert -- -OA$_5$ --, therefor.

Signed and Sealed this
Twenty-eighth Day of January, 2020

Andrei Iancu
*Director of the United States Patent and Trademark Office*